(12) United States Patent
Leman (10) Patent No.: US 12,301,069 B2
(45) Date of Patent: May 13, 2025

(54) ELECTRONIC DEVICE MOUNTABLE IN AN ELECTRICAL MOTOR AND METHOD FOR MANUFACTURING THE SAME

(71) Applicant: Melexis Bulgaria Ltd., Sofia (BG)

(72) Inventor: Dirk Leman, Lier (BE)

(73) Assignee: Melexis Bulgaria Ltd., Sofia (BG)

( * ) Notice: Subject to any disclaimer, the term of this patent is extended or adjusted under 35 U.S.C. 154(b) by 40 days.

(21) Appl. No.: 16/221,862

(22) Filed: Dec. 17, 2018

(65) Prior Publication Data

US 2019/0190354 A1 Jun. 20, 2019

(30) Foreign Application Priority Data

Dec. 18, 2017 (DE) ...................... 10 2017 130 342.1

(51) Int. Cl.
*H05K 1/18* (2006.01)
*H02K 11/33* (2016.01)
(Continued)

(52) U.S. Cl.
CPC ............. *H02K 11/33* (2016.01); *H02K 29/08* (2013.01); *H05K 1/0271* (2013.01); *H05K 1/182* (2013.01);
(Continued)

(58) Field of Classification Search
CPC . H05K 1/021; H05K 1/11; H05K 1/14; H05K 1/18; H05K 1/141–144;
(Continued)

(56) References Cited

U.S. PATENT DOCUMENTS 3,984,739 A * 10/1976 Mochizuki .......... H01L 23/3121
361/764
4,540,603 A * 9/1985 Hidaka ............... H01L 23/3135
257/E23.126
(Continued)

FOREIGN PATENT DOCUMENTS

CN 101534611 A 9/2009
CN 101674710 A 3/2010
(Continued)

OTHER PUBLICATIONS

Belgian Search Report from BE Application No. BE201805892, Sep. 13, 2019.
(Continued)

*Primary Examiner* — Tuan T Dinh
(74) *Attorney, Agent, or Firm* — Workman Nydegger (57) ABSTRACT

An electronic device mountable in an electrical motor and a method for manufacturing an electronic device mountable in an electrical motor are provided. The electronic device includes a printed circuit board with a hole for mounting a semiconductor package which includes an integrated magnetic sensing device, the semiconductor package including leads and reinforcement material. The semiconductor package is mounted in the hole with the leads soldered to the printed circuit board. A gap is present between the semiconductor package and the printed circuit board. The reinforcement material is at least covering part of the leads and at least part of the printed circuit board.

27 Claims, 10 Drawing Sheets (51) Int. Cl.
*H02K 29/08* (2006.01)
*H05K 1/02* (2006.01)
*H05K 3/28* (2006.01)
*H05K 3/34* (2006.01)

(52) U.S. Cl.
CPC .............. *H05K 1/183* (2013.01); *H05K 3/28* (2013.01); *H05K 3/34* (2013.01); *H05K 3/3426* (2013.01); *H02K 2211/03* (2013.01); *H05K 3/284* (2013.01); *H05K 3/3405* (2013.01); *H05K 3/3494* (2013.01); *H05K 2201/09072* (2013.01); *H05K 2201/1003* (2013.01); *H05K 2201/10151* (2013.01); *H05K 2201/10689* (2013.01); *H05K 2201/10977* (2013.01); *H05K 2203/1572* (2013.01)

(58) Field of Classification Search
CPC . H05K 1/181–187; H01L 23/13; H01L 23/34; H01L 23/4985
USPC ................ 361/760, 767–774, 782–784, 803; 174/258–262, 520–525
See application file for complete search history.

(56) References Cited

U.S. PATENT DOCUMENTS

| | | | | |
|---|---|---|---|---|
| 4,729,061 A * | 3/1988 | Brown | ................ | H01L 21/486 174/16.3 |
| 4,773,829 A | 9/1988 | Vettori | | |
| 4,829,666 A * | 5/1989 | Haghiri-Tehrani | ......................... | G06K 19/07745 29/841 |
| 5,198,964 A * | 3/1993 | Ito | ...................... | H01L 23/4334 257/796 |
| 5,357,160 A | 10/1994 | Kaneda et al. | | |
| 5,386,343 A * | 1/1995 | Pao | ........................ | H05K 1/181 361/761 |
| 5,541,450 A * | 7/1996 | Jones | ...................... | H01L 24/49 257/697 |
| 5,550,086 A * | 8/1996 | Tai | .......................... | H01L 24/83 29/841 |
| 5,723,900 A * | 3/1998 | Kojima | ............... | H01L 23/3107 257/666 |
| 5,763,940 A * | 6/1998 | Shibusawa | .......... | H01L 23/3107 257/668 |
| 5,801,438 A * | 9/1998 | Shirakawa | ............ | H01L 23/13 257/678 |
| 5,831,833 A * | 11/1998 | Shirakawa | ............ | H01L 23/13 361/762 |
| 5,835,355 A * | 11/1998 | Dordi | ................. | H01L 23/49572 257/E21.503 |
| 6,093,970 A * | 7/2000 | Ohsawa | .................. | H01L 24/50 257/668 |
| 6,100,804 A * | 8/2000 | Brady | ................ | A01K 11/006 342/51 |
| 6,154,371 A * | 11/2000 | Oba | ....................... | H05K 1/141 257/723 |
| 6,324,067 B1 * | 11/2001 | Nishiyama | ............. | H05K 1/165 174/262 |
| 6,333,566 B1 * | 12/2001 | Nakamura | .............. | H01L 24/85 257/666 |
| 6,459,593 B1 * | 10/2002 | Kwong | ............... | H01L 25/0652 174/255 |
| 6,515,356 B1 * | 2/2003 | Shin | ........................ | H01L 24/97 257/E23.179 |
| 6,552,419 B2 * | 4/2003 | Toyosawa | ........... | H01L 25/0657 257/668 |
| 6,686,609 B1 * | 2/2004 | Sung | ........................ | H01L 33/62 257/E33.059 |
| 6,741,451 B2 * | 5/2004 | Aoyama | ................. | H01G 2/065 29/25.03 |
| 6,833,619 B1 * | 12/2004 | Jang | ...................... | H01L 21/568 257/678 |
| 6,891,717 B2 * | 5/2005 | Fujii | ...................... | H01G 9/012 29/25.03 |
| 6,936,922 B1 * | 8/2005 | Park | ...................... | H05K 3/3436 257/737 |
| 7,317,250 B2 * | 1/2008 | Koh | .......................... | G11C 5/02 174/260 |
| 7,729,102 B2 * | 6/2010 | Kuriyama | .............. | H01G 2/065 361/519 |
| 7,777,308 B2 * | 8/2010 | Yang | .................. | H01L 23/49575 257/666 |
| 7,929,312 B2 * | 4/2011 | Tamura | .................. | H05K 1/021 361/760 |
| 8,269,298 B2 * | 9/2012 | Nagamatsu | ....... | H01L 27/14618 257/432 |
| 9,545,008 B1 * | 1/2017 | Zednicek | ................ | H01G 9/012 |
| 2005/0117271 A1 * | 6/2005 | De Samber | ............. | H01L 24/35 361/306.1 |
| 2008/0094812 A1 | 4/2008 | Kuriyama | | |
| 2008/0303145 A1 | 12/2008 | Takizawa et al. | | |
| 2009/0218121 A1 | 9/2009 | Ishii | | |
| 2009/0273071 A1 | 11/2009 | Kudose et al. | | |
| 2010/0327709 A1 * | 12/2010 | Minato | .................. | H02K 11/33 361/736 |
| 2012/0051017 A1 | 3/2012 | Lee et al. | | |
| 2013/0057095 A1 | 3/2013 | Okinaga et al. | | |
| 2014/0347819 A1 * | 11/2014 | Ott | ...................... | B60R 16/0231 361/714 |
| 2014/0362535 A1 * | 12/2014 | Meier | ................. | H01L 23/4985 361/707 |
| 2015/0342025 A1 | 11/2015 | Fujii et al. | | |
| 2016/0233156 A1 * | 8/2016 | Song | .................... | G06F 13/28 |
| 2016/0242312 A1 * | 8/2016 | Singh | .................... | H01L 23/473 |
| 2016/0276566 A1 | 9/2016 | Pirk et al. | | |
| 2022/0102166 A1 | 3/2022 | Talledo et al. | | |

FOREIGN PATENT DOCUMENTS

| | | |
|---|---|---|
| CN | 102387663 A | 3/2012 |
| CN | 102769997 A | 11/2012 |
| CN | 105720033 A | 6/2016 |
| DE | 1241879 B | 6/1967 |
| DE | 3326968 A1 | 2/1985 |
| DE | 102008062575 A1 | 6/2010 |
| DE | 102013222163 A1 | 5/2015 |
| EP | 0558181 A1 | 9/1993 |
| EP | 1215804 A2 | 6/2002 |

OTHER PUBLICATIONS

German Search Report from DE Application No. 102017130342.1, Dec. 13, 2018.
Chinese Office Action from Corresponding Chinese Patent Application No. CN201811549186.0, Oct. 10, 2023.

* cited by examiner

ELECTRONIC DEVICE MOUNTABLE IN AN ELECTRICAL MOTOR AND METHOD FOR MANUFACTURING THE SAME

FIELD OF THE INVENTION

The invention relates to the field of electronic devices comprising printed circuit boards. More specifically it relates to electronic devices which are mountable in an electrical motor.

BACKGROUND OF THE INVENTION

Recently electronic motors are pushed to have a smaller and smaller diameter. The electronic motors comprise printed circuit boards, which contain driver and magnetic sensing electronics (PCBs). For correct operation of the fan the exact location of the magnetic sensing electronics compared to the permanent magnet motor is key to the performance of the motor. By reducing the diameter and thickness of the printed circuit board it is possible to reduce the diameter and thickness of the electronic motor. This is for example useful for fan motors. Because of size constraints, the PCBs are also reduced in their thickness. This might result into mechanical stress and deformation of the PCB during assembly of the PCB into the motor. Together with vibrations during application work of the motor, this mechanical stress might wear out the soldering of small outline transistors with straight leads and thus to a malfunction of the motor application e.g. the fan.

Figure 1:
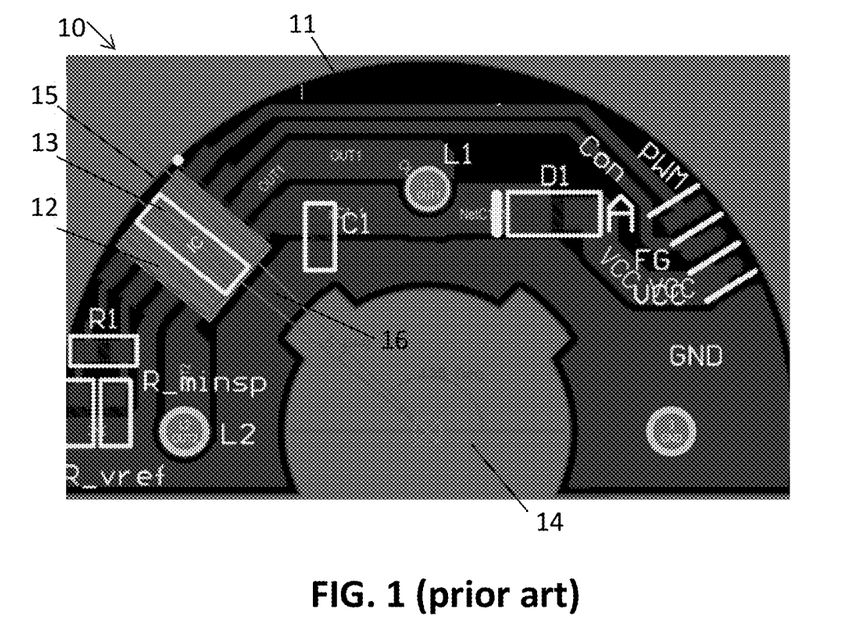
FIG. 1 shows a PCB layout of a prior art electronic device, comprising a hole and a semiconductor package mounted in the hole, which is mountable in an electrical motor.

An example of a prior art electronic device 10 is which is mountable in an electrical motor is illustrated in FIG. 1. It comprises a PCB 11 with a hole 12 for mounting a semiconductor package 13. The semiconductor package 13 may for example be a small outline integrated package with 8 pins (SOIC8). The PCB has a disc like shape with a central through hole 14 through which the motor shaft can extend. Such an electronic device may for example be adapted for detecting motor positional information using a Hall sensor and for controlling power switching elements to drive the electronic motor (e.g. the brushless DC motor).

Figure 2:
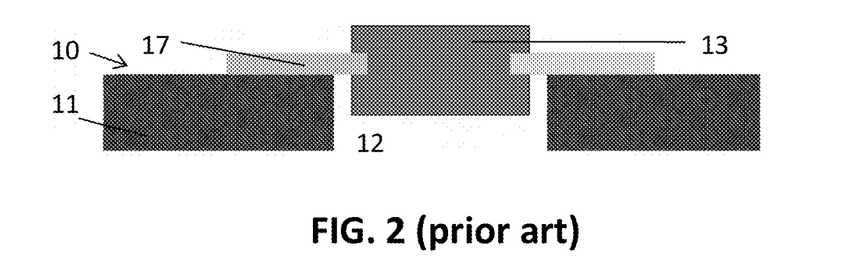
FIG. 2 shows a cross-section of the semiconductor package and part of the PCB of FIG. 1.

FIG. 2 shows a cross-section of the semiconductor package 13 and part of the PCB 11 and illustrates how the semiconductor package 13 is mounted in the hole 12 using pins 17 wherein the pins in this example are straight leads.

Another effect of this prior art solution can be acoustic noise caused by mechanical oscillations of the semiconductor package generated by motor vibrations.

U.S. Pat. No. 4,773,829A discloses an electrical motor with a protective casing wherein the protective casing also contains at least one printed-circuit board for supporting the motor control circuit. The fan motor casing has an annular extension corresponding to the fan housing and the printed-circuit board is housed within said extension and placed in substantially parallel relation to the fan-housing closure disk. The presence of the annular extension makes it possible to give the printed-circuit board a diameter equal to that of the closure disk of the fan housing. This diameter is sufficient to house all the components of the circuit without entailing any need to provide an additional casing irrespective of the power and therefore the dimensions of the fan.

In view of the requirements for reducing the size of the motor, there is a need for reducing the size of electronic devices such that they are mountable in an electrical motor without the need for an annular extension in the housing of the motor.

SUMMARY OF THE INVENTION

It is an object of embodiments of the present invention to provide a good electronic device mountable in an electronic motor and a method for manufacturing such a device.

The above objective is accomplished by a method and device according to the present invention.

In a first aspect embodiments of the present invention relate to an electronic device mountable in an electrical motor. The device comprises:
- a printed circuit board with a hole for mounting a semiconductor package which comprises an integrated magnetic sensing device, the semiconductor package comprising leads,
- and reinforcement material,
  wherein the semiconductor package is mounted in the hole with the leads soldered to the printed circuit board, and wherein a gap is present between the semiconductor package and the printed circuit board,
  wherein the reinforcement material is at least covering part of the leads and at least part of the printed circuit board.

In embodiments of the present invention the reinforcement material may secure the leads to the printed circuit board. In embodiments of the present invention the reinforcement material may also improve the stiffness of the printed circuit board.

Printed circuit boards (PCBs) with a hole, wherein the hole is large enough for mounting a semiconductor package, may have a reduced stiffness when the area of the PCB is reduced. This is especially the case because of the presence of the hole. When the semiconductor package is mounted in the hole a gap is present to ensure that the package fits in the hole. It is an advantage of embodiments of the present invention that the stiffness of the electronic device is increased by covering the leads and at least part of the PCB with reinforcement material. This allows to decrease the area of the electronic devices even more. This is particularly useful for electronic devices which need to be integrated in an electrical motor, especially in applications wherein the size of the motor is a critical parameter (e.g. in fans).

In embodiments of the present invention the reinforcement material is covering at least part of the semiconductor package, at least part of the gap, and at least part of the printed circuit board.

It is an advantage of embodiments of the present invention that the stiffness of the board is increased even more by reinforcement material which is covering the semiconductor package and at least part of the gap. In embodiments of the present invention the reinforcement material may even be covering the semiconductor package, the hole and at least part of the PCB at both sides of the board.

In embodiments of the present invention the gap is at least partly filled with the reinforcement material.

It is an advantage of embodiments of the present invention that the stiffness of the board is increased even more by reinforcement material which is filling at least part of the gap between the semiconductor package and the PCB. In embodiments of the present invention the reinforcement material is filling the gap between the semiconductor package and the PCB all around the semiconductor package.

In embodiments of the present invention the reinforcement material comprises a material which changes its material properties and hardens after being applied.

It is an advantage of embodiments of the present invention that the reinforcement material comprises a material which is flexible when applying it (the reinforcement material may for example be liquid, and may be dispensed through a nozzle) and which hardens after being applied. This enables a good application of the reinforcement material especially on an uneven surface.

In embodiments of the present invention the reinforcement material comprises an epoxy or a resin.

In embodiments of the present invention the printed circuit board only comprises one layer.

It is an advantage of embodiments of the present invention that even a thin board comprising only one layer can be made strong enough by the reinforcement material which at least covers the leads and at least part of the printed circuit board. If no hole is applied a more expensive 2 layer printed circuit board would have to be produced, in order to fit the hall sensor close to the rotor. Also the fan would be more thick, or more exotic packages like 0.4 mm thick UTDFN (ultra-thin dual flat no leads) would have to be applied, which is more complex and expensive to make.

In embodiments of the present invention the leads of the semiconductor package are straight leads.

It is an advantage of embodiments of the present invention that the electronic device is more compact than an electronic device wherein the semiconductor package is not mounted in the hole and/or wherein the semiconductor package has no straight leads.

In embodiments of the present invention the semiconductor package comprises an integrated magnetic sensing device.

In a second aspect embodiments of the present invention relate to an—electronic motor comprising an electronic device in accordance with embodiments of the present invention wherein the electronic device is mounted in a housing of the electronic motor.

It is an advantage of a motor according to embodiments of the present invention that it is compact because the electronic device is integrated in the housing of the motor. Assembly of the electronic device in the housing of the motor, moreover, allows that the semiconductor package is close to the rotor. This is particularly advantageous if the semiconductor package is used to provide rotor position information. This may for example be achieved by a semiconductor package which comprises a magnetic sensing device and which picks up a varying magnetic field induced by the rotating rotor. In that case it is important that the semiconductor package is close to the rotor. It is moreover advantageous that the strength of the electronic device is increased by the reinforcement material which is at least covering part of the leads (or the complete leads) and at least part of the printed circuit board. An increased PCB strength makes a fan more mechanically stable, and thus less prone to vibrations which lead to audible noise.

In a third aspect embodiments of the present invention relate to a method for manufacturing an electronic device comprising an integrated magnetic sensing device which can be mounted in an electrical motor, the method comprising:
providing a printed circuit board with a hole for mounting a semiconductor package in the hole,
applying a solder paste on the printed circuit board,
mounting a semiconductor package comprising leads on the printed circuit board such that the leads are in contact with the solder paste and such that a gap is present between the semiconductor package and the printed circuit board,
applying reinforcement material such that it at least covers the leads and at least part of the printed circuit board, wherein the reinforcement material is such that it changes its material properties and becomes hard after being applied,
reflow soldering the semiconductor package before or after applying the reinforcement material.

It is an advantage of embodiments of the present invention that the strength of the electronic device is increased by applying reinforcement material such that it at least covers the leads and at least part of the printed circuit board.

In embodiments of the present invention the reflow soldering is done after the step applying the reinforcement material.

It is an advantage of embodiments of the present invention that during reflow the reinforcement material hardens even more. It is an advantage of embodiments of the present invention that during assembly the chance for failing solder joints is decreased by applying the reinforcement material which increases the PCB strength and therefore decrease the chance of deformation of the device which leads to failing solder joints.

In embodiments of the present invention the reflow soldering is done before applying the reinforcement material.

It is an advantage of embodiments of the present invention that solder inspection can be done before applying the reinforcement material.

In embodiments of the present invention the reinforcement material is applied as a liquid.

It is an advantage of embodiments of the present invention that the reinforcement material can be easily applied as it is in liquid form when applying it.

In embodiments of the present invention the reinforcement material is applied such that it covers at least part of the semiconductor package, at least part of the gap, and at least part of the printed circuit board.

It is an advantage of embodiments of the present invention that the strength of the electronic device can be increased even more by applying the reinforcement material over at least part of the semiconductor package (or even the complete semiconductor package), at least part of the gap (or the complete gap), and at least part of the printed circuit board than in embodiments wherein the reinforcement material covers the leads and at least part of the printed circuit board.

In embodiments of the present invention the reinforcement material is applied at both sides of the semiconductor package and the printed circuit board.

It is an advantage of embodiments of the present invention that the strength of the electronic device can be increased even more by applying the reinforcement material at both sides of the semiconductor package and the printed circuit board.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

In a first aspect embodiments of the present invention relate to an electronic device 100 which is configured to be mounted in an electrical motor. The device comprises a printed circuit board 110 with a hole 111 for mounting a semiconductor package 120. In such a semiconductor package a semiconductor device is packaged. The semiconductor package 120 comprises leads 121, and reinforcement material 130, wherein the semiconductor package 120 is mounted in the hole 111 with the leads 121 soldered to the printed circuit board 110, wherein the reinforcement material 130 is at least covering part of the leads 121 (or the complete leads) and at least part of the printed circuit board 110. In embodiments of the present invention the reinforcement material also fills at least part of the gap 112 between the body (i.e. the outside surface) of the semiconductor package 120 and the PCB (e.g. the gaps 112 at the sides of the PCB 110 where the leads 121 are present). The electrical motor may for example be a permanent magnet brushless motor.

Figure 3:
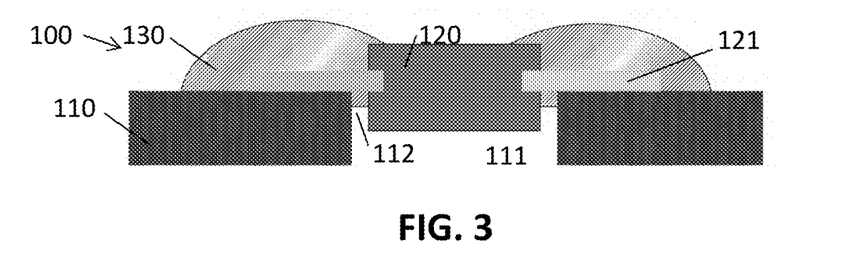
FIG. 3 shows a schematic drawing of a cross-section of a part of an electronic device comprising reinforcement material in accordance with embodiments of the present invention.

FIG. 3 shows a schematic drawing of a cross-section of such an electronic device 100 in accordance with embodiments of the present invention. A cross-section of the semiconductor package 120 and the PCB is shown. In this example only the part of the PCB is shown, which comprises the hole 111 wherein the semiconductor package 120 is mounted. The PCB may for example still extend to form a disc like shape with a central through hole through which a motor shaft can extend.

Figure 4:
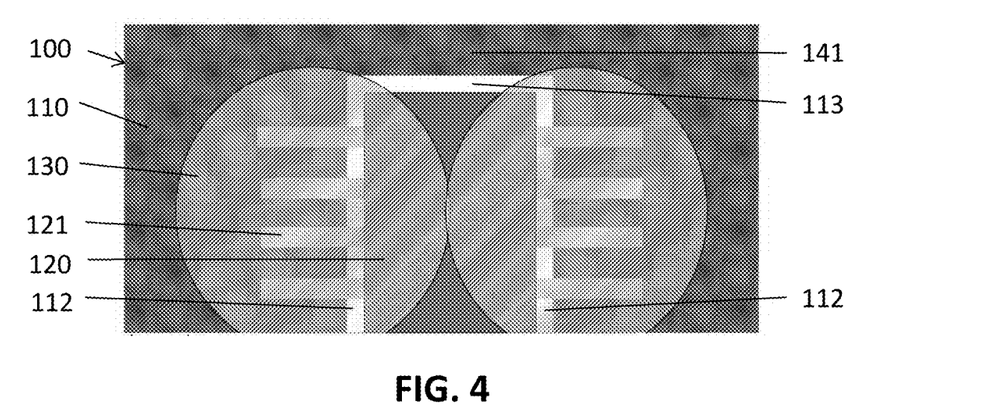
FIG. 4 shows a schematic drawing of a top view of the same electronic device as in FIG. 3 wherein the hole is realized as a U-shape on the side of the PCB in accordance with embodiments of the present invention.

FIG. 4 shows a schematic drawing of a top view of the same electronic device as in FIG. 3. The semiconductor is packaged in a SOIC8 package comprising 8 straight leads. Due to the presence of the hole 111, the PCB has a reduced size between its outer edges and the hole 111. This is the remaining interconnecting part 141. The electronic device is strengthened by the reinforcement material 130 which also fills the gaps 112 at the sides of the PCB 110 where the leads 121 are present. In this example illustrated in FIG. 3 and FIG. 4 the gap 113 at the side of the PCB 110 where the leads 121 are not present is not filled with reinforcement material.

As shown in FIG. 4 the hole 111 may be realized as a U-shape on the side of the PCB, in this case the hole is defined on three sides by the PCB. In case of a 3-sided hole there is an only inner remaining interconnection part 141 (for example corresponding with interconnecting part 16 in FIG. 1).

Figure 5:
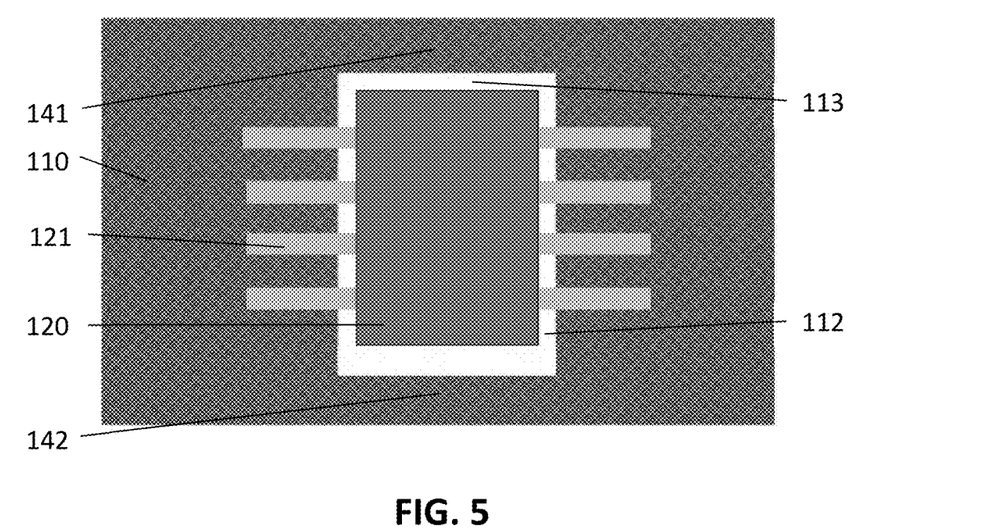
FIG. 5 shows a top view of a semiconductor package and part of the PCB wherein the hole is realized inside the PCB, which may be mounted as an electronic device in accordance with embodiments of the present invention.

An alternative embodiment is shown in FIG. 5, in which the hole is inside the PCB, in which case the hole is defined on the four sides by the PCB. In case of a 4-sided hole there is also an outer remaining interconnecting part 142. In the remainder of the text a hole will refer to either a 3-sided or a 4-sided hole, and the inner and outer remaining interconnecting parts will be referred to as the remaining interconnecting part 140. In the example of FIG. 5 the reinforcement material is not yet applied.

As can be seen in the prior art example illustrated in FIG. 1 the weakest spot of the PCB is at the location of the hole 12 for mounting the semiconductor package where the PCB interconnecting parts 15, 16 become the thinnest. With the push to smaller PCBs the PCB hole 12 becomes therefore the limiting factor for PCB stiffness.

By providing reinforcement material 130 which is at least covering part of the leads 121 and at least part of the printed circuit board 110 the strength of the PCB 110 is significantly increased.

Figure 6:
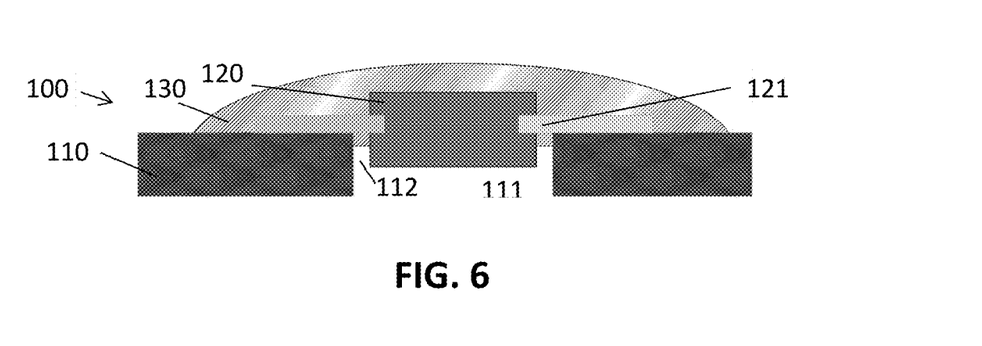
FIG. 6 shows a schematic drawing of a cross-section of a part of an electronic device comprising reinforcement material covering the semiconductor package in accordance with embodiments of the present invention.
Figure 7:
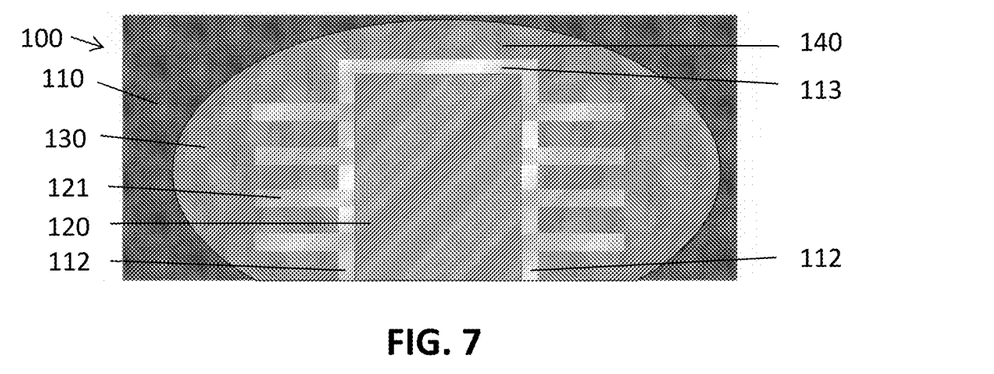
FIG. 7 shows a schematic drawing of a top view of the same electronic device as in FIG. 6.

The reinforcement material 130 may even be covering at least part of or even the complete the semiconductor package 120, the hole 111, and at least part of the printed circuit board 110 to increase the strength even more. This is illustrated in FIG. 6 and FIG. 7 respectively showing a cross-section and a top view of such an electronic device. In embodiments of the present invention the reinforcement material fills the gap between the semiconductor package 120 and the PCB 110. This is also illustrated in FIG. 6 and FIG. 7 as well as in FIG. 8 and FIG. 9. In these figures the gap 112, 113 between the semiconductor package and the PCB is filled all around the semiconductor package with reinforcement material. Also those parts of the gap 113 which are at the sides of the semiconductor package which does not comprise any leads, is filled with reinforcement material.

Figure 8:
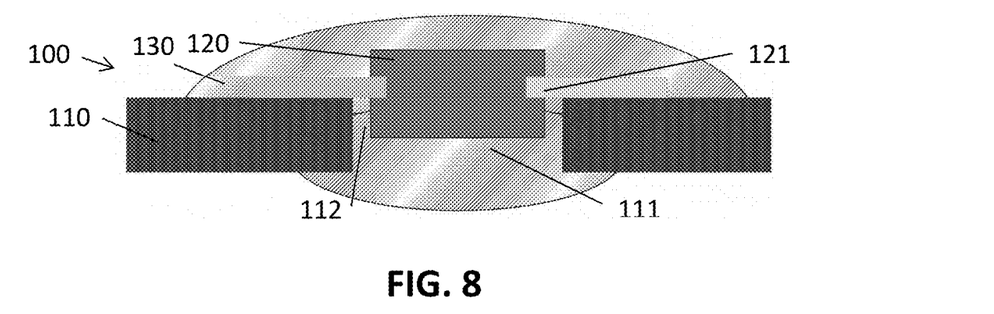
FIG. 8 shows a schematic drawing of a cross-section of a part of an electronic device comprising reinforcement material covering the semiconductor package, the hole and at least part of the PCB at both sides of the PCB.
Figure 9:
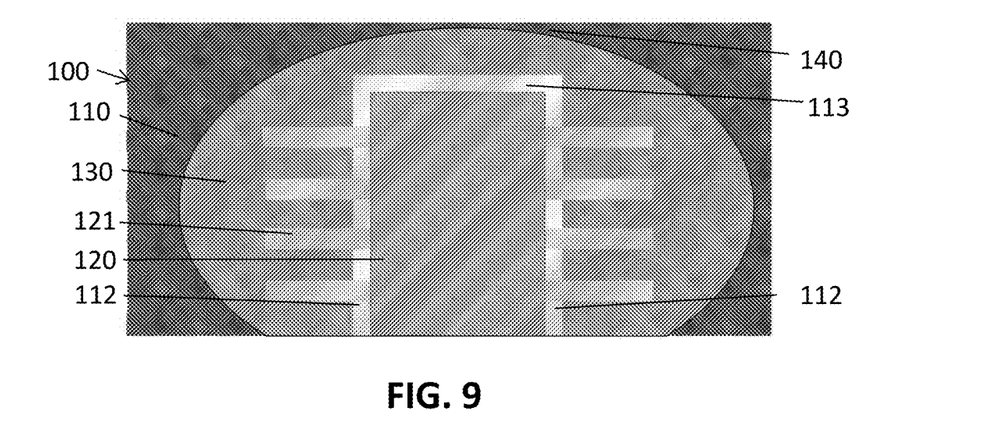
FIG. 9 shows a schematic drawing of a top view of the same electronic device as in FIG. 8.

In embodiments of the present invention the reinforcement material 130 may even be covering at least part of the semiconductor package 120, at least part of the gap and at least part of the PCB 110 at both sides of the PCB. This is illustrated in FIG. 8 and FIG. 9 respectively showing a cross-section and a top view of such an electronic device. By applying the reinforcing material at both sides of the PCB, the PCB stiffness can be increased even more.

It is an advantage of embodiments of the present invention that reinforcement material is at least covering part of the leads of a semiconductor package mounted in the hole of a printed circuit board, or even covering at least part of the gap between that printed circuit board and the semiconductor package, or even at least partly filling this gap. The epoxy can be dispensed over the whole package, to maximize the PCB strength. This is particularly advantageous for printed circuit boards with a shape which is adapted to fit in a device such as an electrical motor. As the adaptation may result in a decreased rigidity (e.g. some part of the board may be removed). It is thereby an advantage of embodiments of the present invention that the rigidity is increased by the reinforcement material which is at least covering the leads of the printed circuit board mounted in the hole of the semiconductor package. In embodiments of the present invention the board may be a circular board. It may have a disk shape or it may have an incomplete disk shape wherein some parts are removed such that the printed circuit board better fits in a device. The inner diameter of the motor and the outer diameter of the electronic device may be such that the electronic device fits in the motor when it is mounted in the motor with its surface orthogonal to the motor axis.

In embodiments of the present invention the amount and the area of the epoxy dispensing is limited in order to reduce the cost of the reinforcing material (by reducing the total amount used, and in order to reduce the time needed for dispensing.

The reinforcing material may therefore be dispensed only on the leads, and even only over part of the leads. As will be discussed in the method steps dispensing of the reinforcing material can be done before or after soldering. Especially in case of dispensing before soldering, dispensing the reinforcing material over part of the leads is helpful because it fixes the leads to the PCB, and minimizes warping of the PCB during the solder reflow.

During solder reflow a difference in expansion coefficients (CTE) between the PCB and semiconductor package may cause deformation.

If the hole 111 in the PCB 110 is a three sided U-shape, the PCB may suffer from severe warping due to PCB heating.

By applying the reinforcement material before solder reflowing it is prevented that the pins lift from the solder paste during heat up and/or cool down, which would result in a weak or no solder joint at all.

In case of dispensing over or in the gap 112, 113 between the semiconductor package and the printed circuit board 110, epoxy with higher viscosity may be required to avoid dripping.

Figure 10:
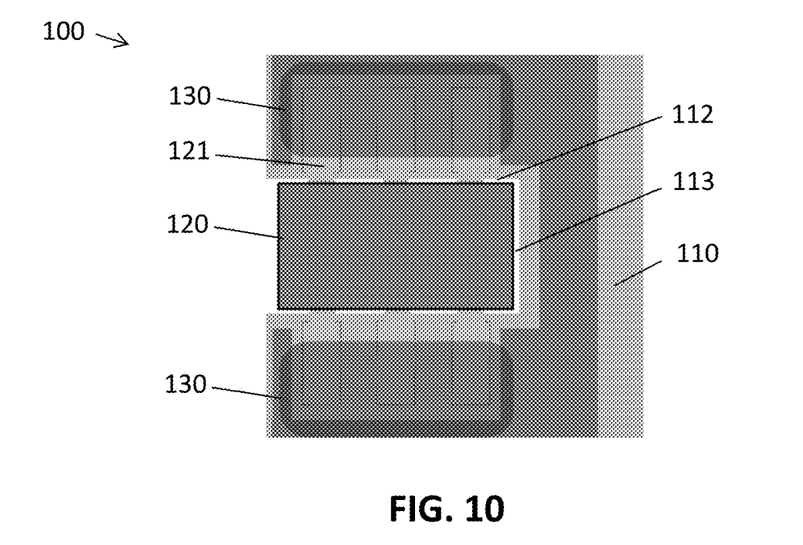
FIG. 10 shows a schematic drawing of an electronic device wherein the reinforcement material is only covering part of the leads and part of the printed circuit board.
Figure 11:
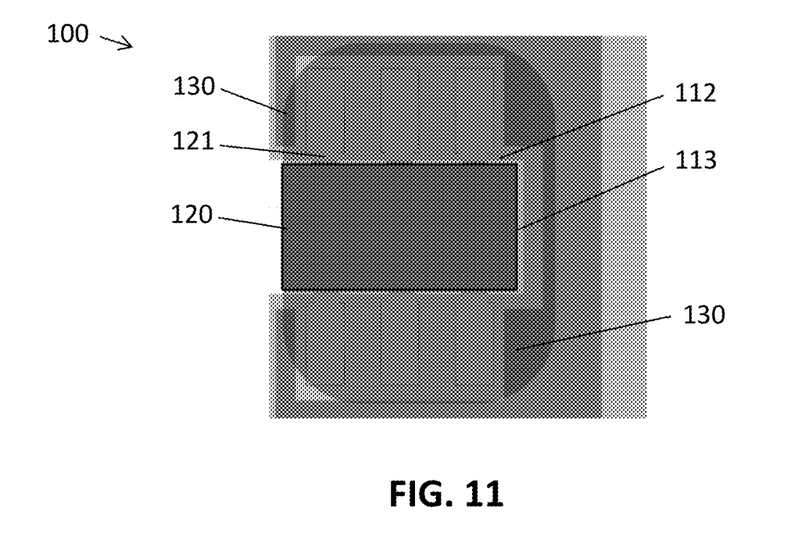
FIG. 11 shows a schematic drawing of an electronic device wherein the reinforcement material is also covering the gap between the printed circuit board and the semiconductor package.

An example where the reinforcement material 130 is only covering part of the leads 121 and part of the printed circuit board 110 is illustrated in the schematic drawing of FIG. 10. In this example the reinforcement material is only covering the solder joints. As the gap 112, 113 between the printed circuit board 110 and the semiconductor package 120 is not covered, dripping of the reinforcement material should not be avoided. Hence a lower viscosity reinforcement material may be used than when the reinforcement material is also covering the gap 112, 113 between the printed circuit board 110 and the semiconductor package 120. The latter case is illustrated in FIG. 11. In this case the reinforcement material is preferable non-dripping when it is applied on the leads and on the PCB especially on the positions covering the gap. In embodiments of this invention, it is also possible to define the gap with tight tolerances such that the capillary effects may allow to use lower viscosity reinforcement materials.

In view of the push to limit the space in an electronic motor, care should be taken that the increase in thickness of the electronic device by applying the reinforcement material is limited. The reinforcement material should not protrude so much that it later on does not fit anymore in the motor construction (e.g. fan motor construction) or such that it might block the rotation of the motor. For instance by applying the PCB hole inside the rotor inner diameter. In this case any protrusions will not touch the rotor.

In embodiments of the present invention the reinforcement material comprises a material which changes its material properties and hardens after being applied. The material may be an epoxy or a resin or a similar material which hardens after being applied. Some of these materials may be referred to as glob top materials. The reinforcement material may also be a tape which can be applied over the pins and the PCB and which clings hard to the leads during reflow.

The table below gives an overview of epoxy materials from MasterBond:

| Type | Cure | Cure temp. | Cure time | Dripping | App. Temp. Range |
| --- | --- | --- | --- | --- | --- |
| UV15x-2GT | UV | Room | 5 min | | 0/+120° C. |
| 3HTND-2GT | Heat | 150° C. | 5-10 min | | −70/200° C. |
| EP21ND | Heat | 150° C. | 5-10 min | No | −50/+120° C. |
| EP51ND | Heat | 90° C. | 5 min | No | −70/+120° C. |

The reinforcement materials may for example be hardened by UV or by heating or by any other method to stabilize the reinforcement material.

In embodiments of the present invention the PCB may comprise one or more layers. Holes are typically applied for sensored permanent magnet BLDC motors. The magnetic sensors are then applied in the holes to be close enough to the permanent magnets on the rotor, to measure their magnetic field lines with sufficient signal strength. A single sided PCB (1s0p according to JEDEC standard) allows to simplify the manufacturing steps of the motor, in that all SMD components can be soldered on one side, and the mounting of the PCB on the stator, can easily be done with through hole soldering, on that same side of the PCB. Therefore single layer PCB's with holes are very popular for such motors. In some cases the hole can be applied on a multi-layer PCB. For instance because the PCB spacing is too large, or the PCB is too thick, and or more signal line speed to be applied to electrically interconnect the electrical components on the PCB, or to dissipate more energy from the board. Regardless of the number of layers of the PCB, it is advantageous to reinforce the PCBs with reinforcement material which is at least covering part of the leads and at least part of the printed circuit board.

Figure 12:
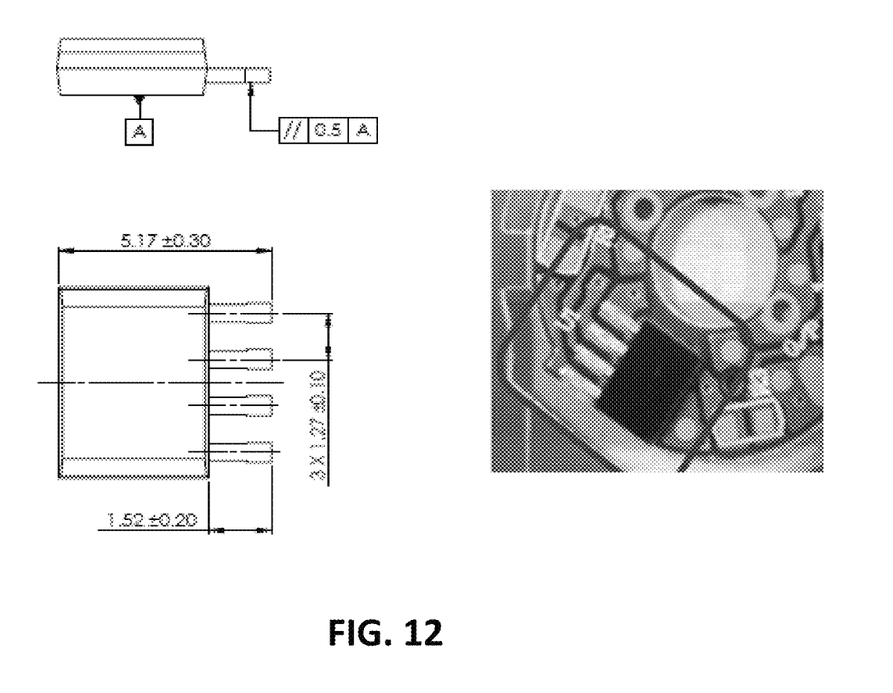
FIG. 12 shows an example of a straight leads package with cut leads which can be mounted in a hole on a PCB of an electronic device in accordance with embodiments of the present invention.

In embodiments of the present invention the semiconductor package may for example be a small outline transistor (SOT) or a small outline integrated circuit (SOIC) comprising straight leads, or even SIP packages with cut leads as shown in FIG. 12, in which a significant part, for instance 0.1 mm up to 1 mm or even 2 mm of the outer side of the lead is straight or flat, i.e. not bent. The invention is, however, not limited thereto. In the example the leads are cut to 1.54 mm. Straight lead packages offer the benefit of easy and stable mounting of the package into the PCB hole, and at the same time allows to have a minimum size solder joint for reliable electrical contact, ensure operation over long life time. The mounting in the PCB hole allows assembly into motor constructions, at a spacing relatively close to the permanent magnets on the rotor. This is for example advantageous in case the semiconductor package comprises a magnetic sensing device to determine the rotor positions. In that case it is important that the magnetic sensing device inside the semiconductor package is positioned close enough to the permanent magnets on the rotor such that it can provide rotor position information to the brushless motor controller. In embodiments of the present invention the magnetic sensing device integrated in the electronic device comprises a Hall sensor.

Figure 13:
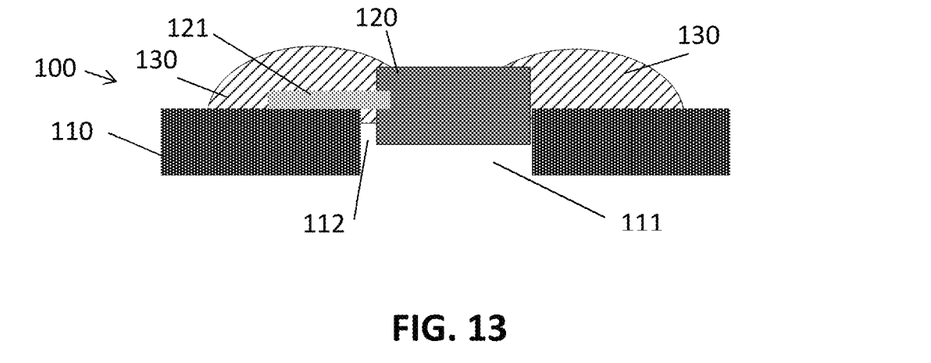
FIG. 13 shows a schematic drawing of a cross-section of a part of an electronic device comprising reinforcement material wherein the semiconductor package only comprises leads on one side of the package, in accordance with embodiments of the present invention.

In FIG. 13 the semiconductor package 120 only comprises leads on one side of the package. In this example the side of the leads but also the opposite side is covered with reinforcement material 130. Also the gap 112 between the semiconductor package 120 and the PCB 110 at the side of the leads 112 is at least partly filled with reinforcement material 130.

Figure 14:
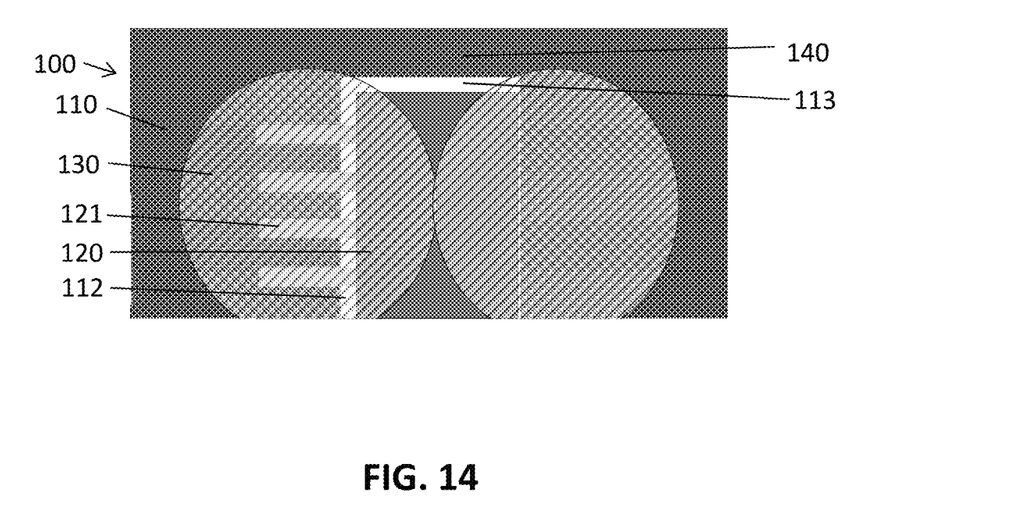
FIG. 14 shows a schematic drawing of a top view of the same electronic device as in FIG. 13.

FIG. 14 shows a schematic drawing of a top view of the same electronic device as in FIG. 13. As can be seen from this figure the gap 113 between the semiconductor package 120 and the PCB 110 is in the example not covered with reinforcement material. In other examples this gap may also be covered. It may also be partially or completely filled.

Figure 15:
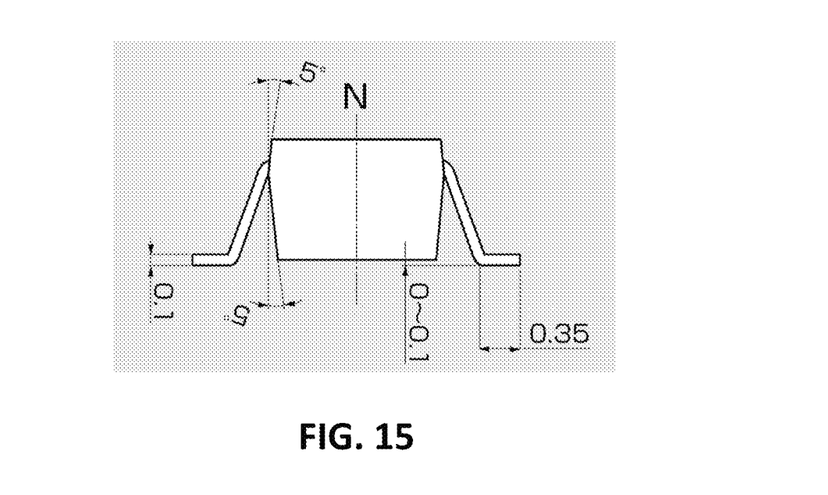
FIG. 15 shows a semiconductor package comprising leads which have a non-straight shape which may be mounted in a hole of a PCB of a semiconductor device in accordance with embodiments of the present invention.

In the previous example the leads had a straight shape. In other embodiments of the present invention some parts of the leads may have a non-straight shape, as shown in FIG. 15. They may be specifically formed such that the semiconductor package 120 can be assembled deeper into the hole 111. In that case the gap between the semiconductor package and the printed circuit board may be wider.

The gap between the semiconductor package and the printed circuit board may be smaller than 3 mm, or even smaller than 1 mm, or even smaller than 0.5, or even smaller than 0.3 mm, or even smaller than 0.2 mm. Typically the gaps are around 0.1 mm. It can also be conceived to apply standard bent leads packages, however this is more difficult to mount stable into the PCB hole.

In a second aspect embodiments of the present invention relate to an electronic motor 300 comprising an electronic device according to embodiments of the present invention, wherein the electronic device is mounted in a housing of the electronic motor 300. The electric motor may for example be a permanent magnet brushless DC motor. A part of such a motor 300 is schematically drawn in FIG. 16. It shows a rotor 310 comprising permanent magnets 311. A stator coil 321, a bearing 322 on which a rotor 310 can be mounted. The figure also shows a PCB 110 mounted on the stator 320 and a semiconductor package 120 in a hole 111 in the PCB. In the semiconductor package 120 a semiconductor device (integrated circuit) is mounted. In this example this semiconductor device comprises a magnetic sensor. The stator 320 and the mounted PCB may be mounted in a housing of the electronic motor.

Figure 16:
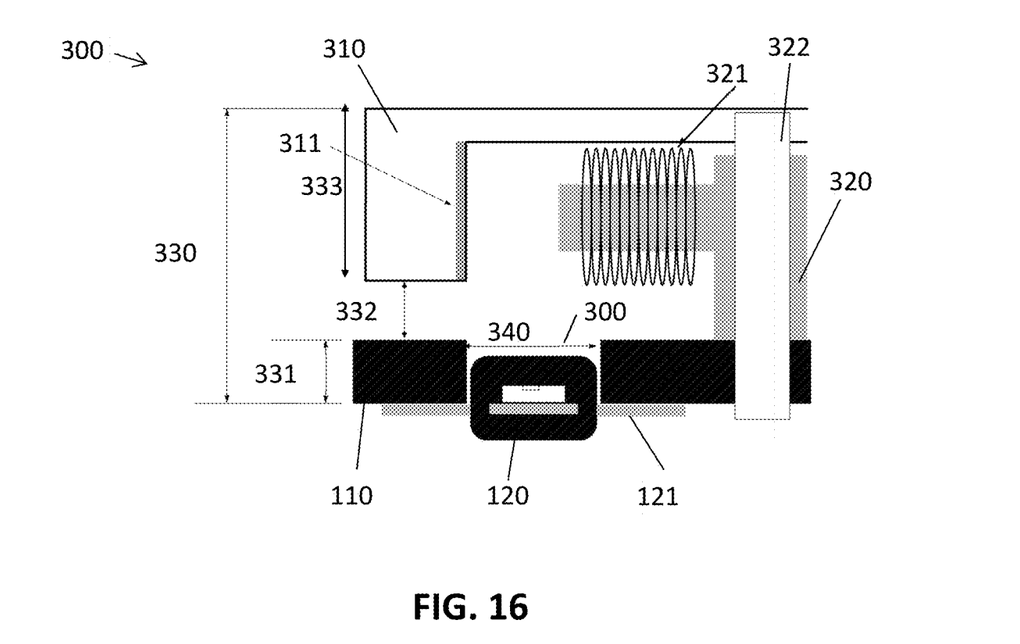
FIG. 16 shows a schematic drawing of a part of an electronic motor in accordance with embodiments of the present invention.

The total internal thickness 330 of the motor (e.g. the fan internal height) comprises the thickness 331 of the PCB, the PCB spacing 332 between the PCB and the rotor 310, and the height 333 of the rotor. The PCB thickness 331 may for example range between 0.8 (see picture example) and 1.5 mm. In some cases the PCB thickness 331 may even be as thin as 0.4 mm. The PCB spacing 332 may for example range between 0.1 mm and 5 mm. The height 333 of the rotor may for example range between 0.1 mm (in case of a flat rotor, see FIG. 17) and 20 mm. The hole may for example have a width 340 (between the sides where the leads 121 of the semiconductor package are mounted) between 0 mm and 1 mm outside of the package body dimensions (i.e. the dimensions of the gap between the semiconductor package mounted in the hole and the printed circuit board).

In order to achieve thinnest possible fan design, the PCB thickness 331 and package height play an important role. A minimum PCB spacing 332 is needed between rotor and PCB to account for mechanical instabilities, vibrations and production tolerances.

Figure 17:
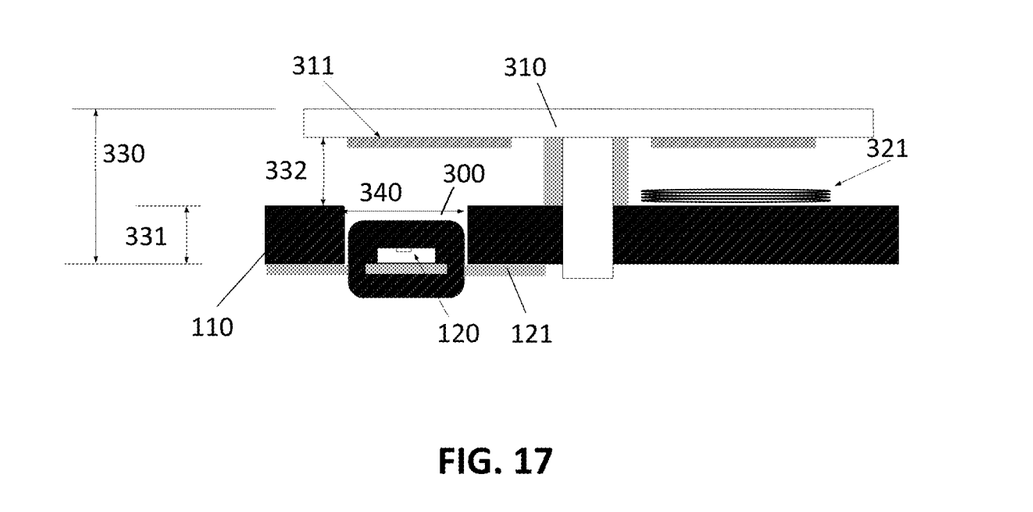
FIG. 17 shows a schematic drawing of a part of an electronic motor comprising a flat rotor in accordance with embodiments of the present invention.

FIG. 17 shows an electronic motor comprising a flat rotor in accordance with embodiments of the present invention. The same components are present as in FIG. 16. However, due to the flat design of the rotor, the thickness of the motor can be decreased even more.

By use of straight leads packages the thickness of the fandriver can be largely absorbed. By using a straight leads package the hall sensor can be placed close to the permanent magnets to ensure strongest magnet field strength at the location of the hall sensor.

Straight leads packages also allow to easily solder the SMD components on one side of a single layer (1s0p) board, which further reduces the PCB cost.

A means to reduce the fan thickness is by reducing the PCB thickness. Making the PCB thinner will, however, make the PCB less stable. It is therefore advantageous that PCBs comprising a hole are reinforced using the reinforcement material which covers at least part of the leads and at least part of the printed circuit board in accordance with embodiments of the present invention.

Figure 18:
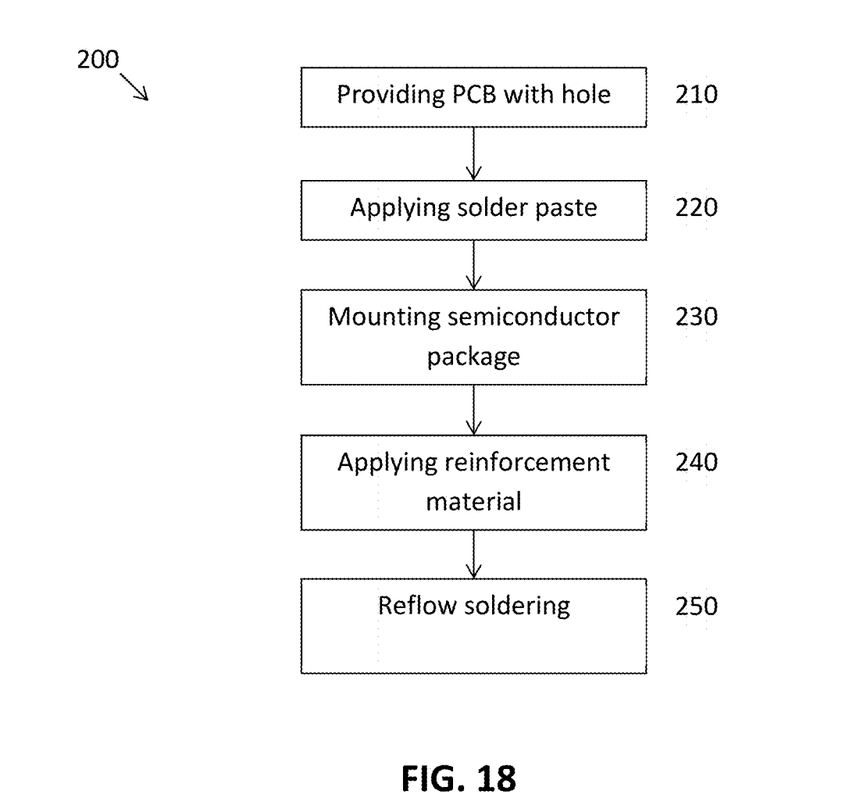
FIG. 18 shows the flow chart of an exemplary method in accordance with embodiments of the present invention.

In a third aspect embodiments of the present invention relate to a method 200 for manufacturing an electronic device which can be mounted in an electrical motor. An exemplary method, according to embodiments of the present invention, is illustrated in the flow chart in FIG. 18. The method comprises:
  providing 210 a printed circuit board with a hole for mounting a semiconductor package in the hole,
  applying 220 a solder paste on the printed circuit board,
  mounting 230 a semiconductor package comprising leads on the printed circuit board such that the leads are in contact with the solder paste and such that a gap is present between the semiconductor package and the printed circuit board,
  applying 240 reinforcement material such that it at least covers the leads and at least part of the printed circuit board, wherein the reinforcement material is such that it changes its material properties and becomes hard after being applied,
  reflow soldering 250 the semiconductor package before or after applying the reinforcement material.

Applying the reinforcement material may be done before or after the reflow soldering. In both cases the strength of the electronic device is increased. In embodiments of the present invention the reinforcement material is applied such that it fills at least part of the gap between the semiconductor package (which is mounted in the hole) and the PCB. Thus the strength of the electronic device is increased even more. The reinforcement material may be applied on both sides of the PCB and the semiconductor package.

The reflow step may for example be followed by a visual inspection step and/or an electronic conductivity check. The reinforcement may for example be applied after the visual inspection step.

The step wherein the reinforcement material is applied is followed by a bake or UV stabilization step or any other step to stabilize the reinforcement material. Stabilizing the reinforcement material before the reflow soldering reaches its peak temperature at which the solder joints are formed, has as advantage that the number of failing solder joints can be reduced because the leads are fixed to the PCB, and because the strength of the electronic device is increased by applying the reinforcement material and therefore the PCB deformation is decreased. Moreover, as the hardening can occur at lower temperatures than the peak reflow temperature at which the solder joints are formed, the reinforcement material can harden as part of the first temperature increase of the reflow soldering temperature profile. This will keep the leads in a good position for good solder joint with electronic contacts (e.g. lands, traces) on the PCB.

The steps wherein the electronic device is manufactured may be followed by a step wherein the electronic device is mounted in a brushless DC motor.

Figure 19:
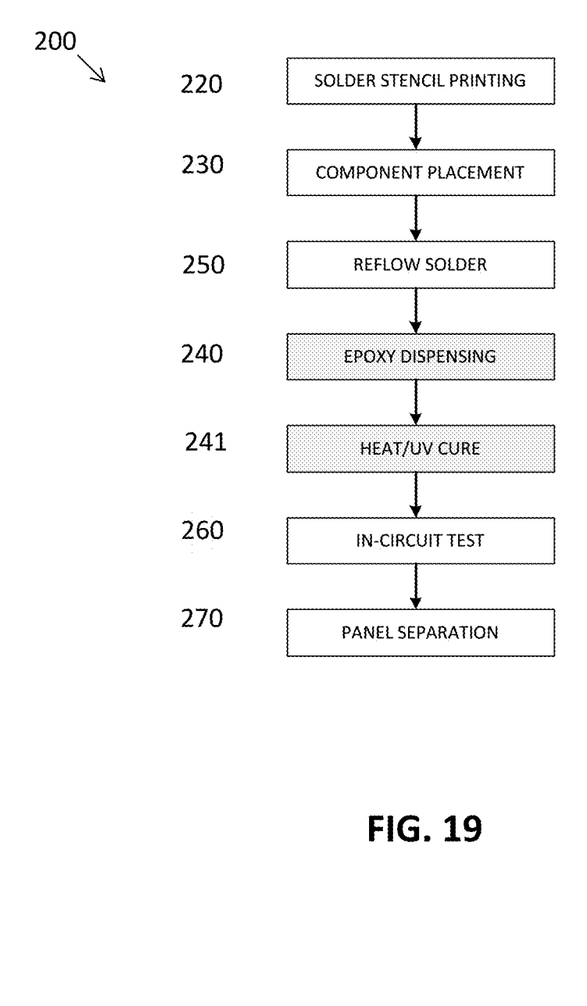
FIG. 19 shows a flow chart of a sequence of steps of an exemplary method in accordance with embodiments of the present invention wherein the reflow soldering is done before applying the reinforcement material.

FIG. 19 shows a flow chart of a sequence of steps of an exemplary method 200 in accordance with embodiments of the present invention. Applying 220 the solder paste on the PCB is done using a solder stencil printing step. The step is followed by a step 230 wherein the semiconductor package is mounted in the hole of the PCB. During this step different components may be placed on the PCB. The mounting step is followed by a reflow soldering step 250, after which the reinforcement material is applied 240. In this example this is achieved by epoxy dispensing. The invention is, however, not limited to epoxy dispensing. Other reinforcement materials may be applied. The epoxy dispensing step is followed by a heat/UV cure 241. Other steps which may follow are an in-circuit test 260 and a panel separation 270.

Figure 20:
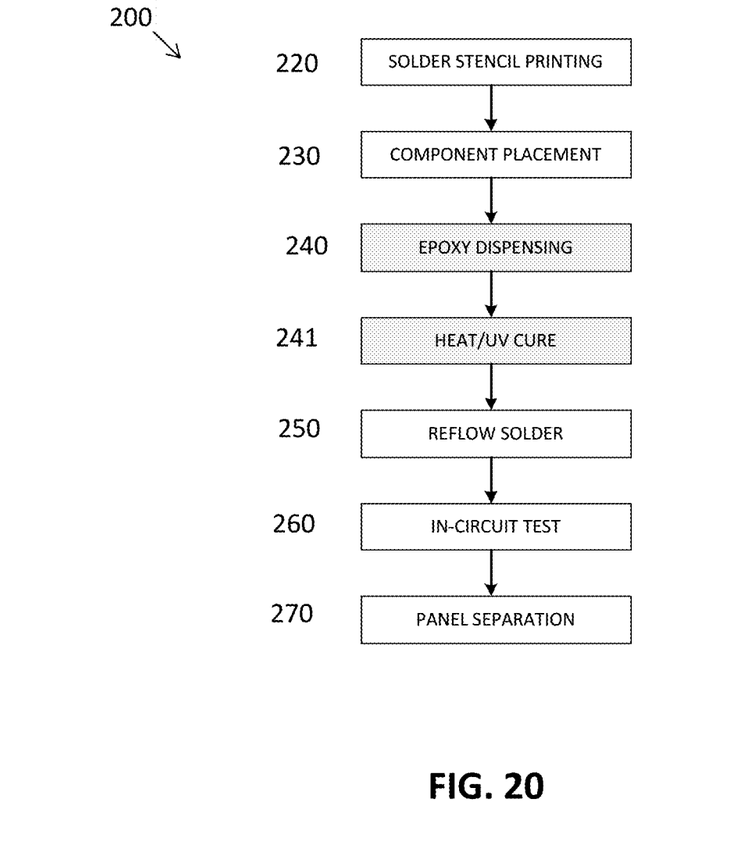
FIG. 20 shows a flow chart of a sequence of steps of an exemplary method in accordance with embodiments of the present invention wherein the reinforcement material is applied before doing the reflow soldering.

FIG. 20 shows a flow chart of a sequence of steps of an exemplary method 200 in accordance with embodiments of the present invention. This example differs from the example in FIG. 19 in that the reinforcement material 240 is applied before the reflow soldering step 250. Also the heat/UV cure step 241 is done before the reflow soldering step 250.

If the reinforcement material (e.g. epoxy) is dispensed on the leads before reflow, the reinforcement material can fix the pins more firm to the PCB, and reinforce the PCB. Thereby the PCB warping can be reduced. Moreover, the leads can be held in position relative to the PCB during the reflow. The hardening of the reinforcement material can be done with UV before the reflow and/or using the heat from the reflow profile. Optionally the reflow profile can be slightly adapted to have optimal hardening, for instance at 160° C., before going through the peak temperature of for instance 260° C. for the lead free soldering. During cool down the mismatch between expansion coefficients (CTE) between the PCB and the semiconductor package will make the semiconductor package shift position, preventing weak or broken solder joints.

The reinforcement material may also be applied after the reflow soldering (e.g. in case pcb warping is limited, and the straight leads component can be soldered in a reliable way).

The presence of the reinforcement material which at least covers part of the leads of a semiconductor package which is mounted in a hole in a PCB and at least part of the PCB has moreover additional advantages. For instance during ICT (in circuit testing) on the panel of PCBs, the pogo pins may bend the PCB. The added reinforcement material (e.g. glob top) will reinforce the PCB as a whole, and will limit the stress on the solder joints due to the bending.

Also during panel separation, for instance by punching or milling/sawing, vibration or bending stress may be reduced thanks to the reinforcement material (e.g. glob top).

Moreover, during operation of the electric motor (e.g. fan), the reinforcement material (e.g. glob top) will reinforce the PCB. Thereby vibration of the PCB can be reduced. This may benefit in a reduced acoustic noise, and less mechanical wear resulting in longer life time.

The invention claimed is:

1. An electronic device mountable in an electrical motor, the electronic device comprising:
   a semiconductor package that comprises an integrated magnetic sensing device, the semiconductor package comprising leads that are rigid;
   a printed circuit board with a through hole, the through hole being defined by an inner edge of the printed circuit board; and
   a reinforcement material,
   wherein the semiconductor package is mounted in the through hole with the leads soldered to the printed circuit board, wherein the leads have a straight shape or are formed such that the semiconductor package is assembled deeper in the hole compared to a semiconductor package with leads with a straight shape, and wherein a gap is present between the semiconductor package and the printed circuit board,
   wherein the reinforcement material is at least covering part of the leads, and
   wherein the stiffness of the printed circuit board is increased by the reinforcement material, on a first side of the printed circuit board, extending beyond the through hole and the inner edge of the printed circuit board and covering at least a part of the first side of the printed circuit board, and on a second side of the printed circuit board the reinforcement material extending beyond the through hole and the inner edge of the printed circuit board and covering at least a part of the second side of the printed circuit board, the second side of the printed circuit board being opposite from the first side of the printed circuit board, and
   wherein on the first side of the printed circuit board or on the second side of the printed circuit board, at another part of the printed circuit board, the printed circuit board is not covered by the reinforcement material, and wherein the printed circuit board is configured to be mounted on a stator of a motor or wherein a stator coil of the motor is provided on the PCB.

2. The electronic device according to claim 1, wherein the reinforcement material is covering at least part of the semiconductor package, at least part of the gap, and at least part of the printed circuit board.

3. The electronic device according to claim 1, wherein the gap is at least partly filled with the reinforcement material.

4. The electronic device according to claim 1, wherein the reinforcement material comprises a material of which material properties change and which hardens after being applied.

5. The electronic device according to claim 1, wherein the printed circuit board only comprises one layer.

6. The electronic device according to claim 1, wherein the leads of the semiconductor package are straight leads.

7. The electronic device according to claim 1, wherein the reinforcement material completely covers the leads.

8. The electronic device according to claim 1, wherein on at least the first side of the printed circuit board the reinforcement material completely covers the semiconductor package.

9. The electronic device according to claim 1, wherein on at least a second side of the printed circuit board the reinforcement material extends beyond an uppermost surface of the second side of the printed circuit board.

10. The electronic device according to claim 1, wherein the reinforcement material completely covers the semiconductor package, the gap, and the leads.

11. The electronic device according to claim 1, wherein the leads have a straight shape.

12. The electronic device according to claim 1, wherein the leads are formed such that the semiconductor package is assembled deeper in the hole compared to a semiconductor package with leads with a straight shape.

13. The electronic device according to claim 1, wherein on the first side of the printed circuit board, at the other part of the printed circuit board, the printed circuit board is not covered by the reinforcement material.

14. The electronic device according to claim 1, wherein on the second side of the printed circuit board, at the other part of the printed circuit board, the printed circuit board is not covered by the reinforcement material.

15. The electronic device according to claim 1, wherein the printed circuit board is configured to be mounted on a stator of a motor.

16. The electronic device according to claim 1, wherein a stator coil of the motor is provided on the PCB.

17. The electronic device according to claim 4, wherein the reinforcement material comprises an epoxy or a resin.

18. The electronic device according to claim 9, wherein on at least the second side of the printed circuit board the reinforcement material is completely covering the semiconductor package.

19. The electronic device according to claim 9, wherein the leads are soldered to the first side of the printed circuit board.

20. The electronic device according to claim 12, wherein the leads are formed such that the semiconductor package is arranged completely in the hole.

21. An electronic motor comprising
    an electronic device mounted in a housing of the electronic motor,
    wherein the electronic device includes
    a semiconductor package that comprises an integrated magnetic sensing device, the semiconductor package comprising leads that are rigid, a printed circuit board with a through hole, the through hole being defined by an inner edge of the printed circuit board; and a reinforcement material, wherein the semiconductor package is mounted in the through hole with the leads soldered to the printed circuit board, wherein the leads have a straight shape or are formed such that the semiconductor package is assembled deeper in the hole compared to a semiconductor package with leads with a straight shape, and wherein a gap is present between the semiconductor package and the printed circuit board, and wherein the reinforcement material is at least covering part of the leads, and wherein the stiffness of the printed circuit board is increased by the reinforcement material, on a first side of the printed circuit board, extending beyond the through hole and the inner edge of the printed circuit board and covering at least a part of the first side of the printed circuit board, and on a second side of the printed circuit board the reinforcement material extending beyond the through hole and the inner edge of the printed circuit board and covering at least a part of the second side of the printed circuit board, the second side of the printed circuit board being opposite from the first side of the printed circuit board, and wherein on the first side of the printed circuit board or on the second side of the printed circuit board, at another part of the printed circuit board, the printed circuit board is not covered by the reinforcement material, and wherein the printed circuit board is mounted on a stator of the motor or wherein a stator coil of the motor is provided on the PCB.

22. A method for manufacturing an electronic device configured to be mounted in an electrical motor, the method comprising:

providing a semiconductor package that comprises an integrated magnetic sensing device, the semiconductor package comprising leads that are rigid;

providing a printed circuit board with a through hole, the through hole being defined by an inner edge of the printed circuit board;

applying a solder paste on the printed circuit board, mounting the semiconductor package on the printed circuit board such that the leads are in contact with the solder paste and such that a gap is present between the semiconductor package and the printed circuit board, wherein the leads have a straight shape or are formed such that the semiconductor package is assembled deeper in the hole compared to a semiconductor package with leads with a straight shape, applying reinforcement material such that the stiffness of the printed circuit board is increased by the reinforcement material covering at least the leads and the reinforcement material, on a first side of the printed circuit board, extending beyond the through hole and the inner edge of the printed circuit board and covering at least a part of the first side of the printed circuit board and such that on a second side of the printed circuit board the reinforcement material extending beyond the through hole and the inner edge of the printed circuit board and covers at least a part of the second side of the printed circuit board, the second side of the printed circuit board being opposite from the first side of the printed circuit board, wherein on the first side of the printed circuit board or on the second side of the printed circuit board, at another part of the printed circuit board, the printed circuit board is not covered by the reinforcement material, and wherein the printed circuit board is configured to be mounted on a stator of the electrical motor or wherein a stator coil of the electrical motor is provided on the PCB, and wherein the material properties of the reinforcement material change and the reinforcement material becomes hard after being applied; and reflow soldering the semiconductor package before or after applying the reinforcement material.

23. The method according to claim 22, wherein the reflow soldering is done after the step applying the reinforcement material.

24. The method according to claim 22, wherein the reflow soldering is done before applying the reinforcement material.

25. The method according to claim 22, wherein the reinforcement material is applied as a liquid.

26. The method according to claim 22, wherein the reinforcement material is applied such that the reinforcement material covers at least part of the semiconductor package, at least part of the gap, and at least part of the printed circuit board.

27. The method according to claim 26, wherein the reinforcement material is applied at both sides of the semiconductor package and the printed circuit board.

* * * * *